United States Patent
Chang et al.

(10) Patent No.: US 11,886,666 B1
(45) Date of Patent: Jan. 30, 2024

(54) FINGERPRINT DETECTION SYSTEM AND A DETECTION CIRCUIT ADAPTABLE THERETO

(71) Applicant: Himax Technologies Limited, Tainan (TW)

(72) Inventors: Yaw-Guang Chang, Tainan (TW); Jia-Ming He, Tainan (TW); Zong-You Hou, Tainan (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 18/090,297

(22) Filed: Dec. 28, 2022

Related U.S. Application Data

(60) Provisional application No. 63/370,676, filed on Aug. 8, 2022.

(51) Int. Cl.
  *G06F 3/042* (2006.01)
  *H03M 1/50* (2006.01)
  *H03M 1/60* (2006.01)

(52) U.S. Cl.
  CPC .............. *G06F 3/042* (2013.01); *H03M 1/50* (2013.01); *H03M 1/60* (2013.01)

(58) Field of Classification Search
  CPC .......... G06F 3/042; G06F 21/32; H03M 1/50; H03M 1/60; H03K 17/941; H01L 27/14643; G06V 40/12
  See application file for complete search history.

(56) References Cited

U.S. PATENT DOCUMENTS

| | | | | |
|---|---|---|---|---|
| 2006/0054790 | A1* | 3/2006 | Schmidt | H03F 3/087 250/214 A |
| 2007/0008592 | A1* | 1/2007 | Yamada | H01L 27/14609 348/E3.021 |
| 2010/0045642 | A1* | 2/2010 | Satoh | H01L 23/552 345/98 |
| 2010/0060562 | A1* | 3/2010 | Hadwen | H01L 31/02164 250/208.2 |
| 2010/0254544 | A1* | 10/2010 | Kimura | H04B 15/005 381/94.1 |
| 2017/0293791 | A1* | 10/2017 | Mainguet | G06V 40/1318 |
| 2020/0104563 | A1* | 4/2020 | Ryu | G02B 6/0053 |
| 2020/0334437 | A1* | 10/2020 | He | H04M 1/026 |
| 2021/0209326 | A1* | 7/2021 | Cao | G06V 40/1318 |
| 2022/0391036 | A1* | 12/2022 | Tada | G06F 3/04166 |

* cited by examiner

*Primary Examiner* — Hong Zhou
(74) *Attorney, Agent, or Firm* — Donald E. Stout; Stout, Uxa & Buyan, LLP

(57) ABSTRACT

A detection circuit adaptable to a fingerprint detection system includes an integrating amplifier coupled to receive a photo-detected voltage from a sensor panel and configured to generate time integral of the photo-detected voltage, thereby resulting in a time-integral signal; and an analog-to-digital converter (ADC) that converts the time-integral signal into a digital form. A first common-mode voltage of the sensor panel is coupled to the integrating amplifier to prevent noise occurred in the first common-mode voltage from affecting the time-integral signal.

13 Claims, 5 Drawing Sheets

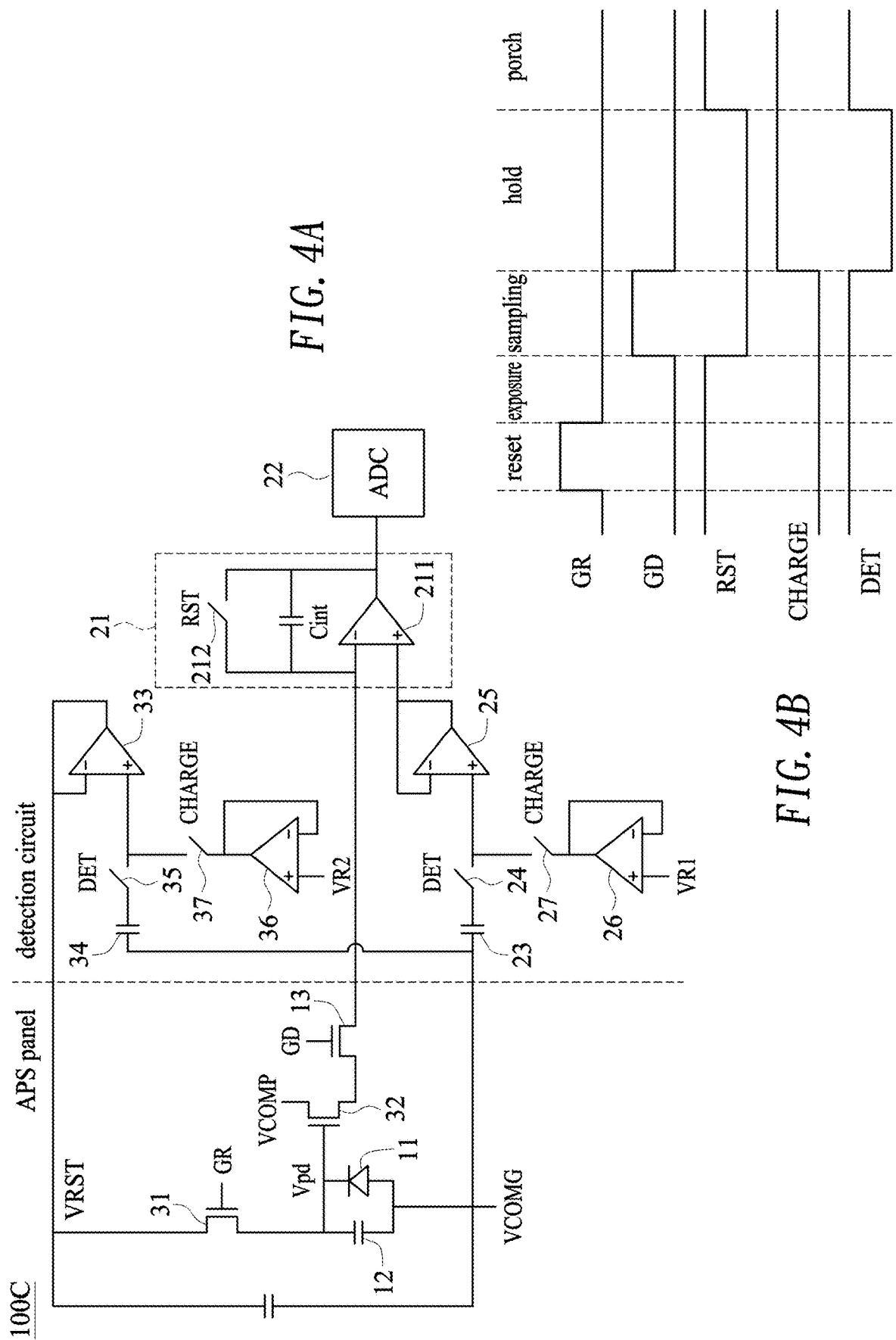

US 11,886,666 B1

FINGERPRINT DETECTION SYSTEM AND A DETECTION CIRCUIT ADAPTABLE THERETO

This application claims the benefit of U.S. Provisional Application No. 63/370,676, filed on Aug. 8, 2022, the entire contents of which are herein expressly incorporated by reference.

BACKGROUND OF THE INVENTION

1. Field of the Invention

The present invention generally relates to fingerprint detection, and more particularly to a detection circuit adaptable to a fingerprint detection system.

2. Description of Related Art

A fingerprint sensor is an electronic device used to capture a digital image of the fingerprint pattern, which is digitally processed, stored and used for matching. The fingerprint sensor adopts a variety of technologies such as optical, capacitive, radio frequency, thermal or ultrasonic.

A detection circuit is adopted to identify the fingerprint by processing sense signals received from a photo sensor. However, the photo sensor is liable to sensor power noise or fluctuation, particularly in the exposure and sampling intervals. Therefore, the sense signals received by the detection circuit are not correct, and the identification results may be substantially affected.

A need has thus arisen to propose a novel scheme to compensate for the sensor power noise in the fingerprint detection system.

SUMMARY OF THE INVENTION

In view of the foregoing, it is an object of the embodiment of the present invention to provide a detection circuit adaptable to a fingerprint detection system capable of preventing a photo-detected voltage (of a photo detector) from being affected by sensor power noise.

According to one embodiment, a fingerprint detection system includes a sensor panel and a detection circuit. The sensor panel includes a photo diode having an anode electrode connected to a first common-mode voltage and a cathode electrode providing a photo-detected voltage; and a sampling switch coupled to receive the photo-detected voltage. The detection circuit includes an integrator coupled to receive the photo-detected voltage via the sampling switch and configured to generate time integral of the photo-detected voltage, thereby resulting in a time-integral signal; and an analog-to-digital converter (ADC) that converts the time-integral signal into a digital form. The first common-mode voltage is coupled to the integrator to prevent noise occurred in the first common-mode voltage from affecting the time-integral signal.

BRIEF DESCRIPTION OF THE DRAWINGS

FIG. 4A shows a circuit diagram illustrating a fingerprint detection system adaptable to an active-pixel sensor (APS) panel according to a third embodiment of the present invention;
FIG. 4B shows a timing diagram illustrating pertinent signals of the fingerprint detection system of FIG. 4A.

DETAILED DESCRIPTION OF THE INVENTION

Figure 1A:
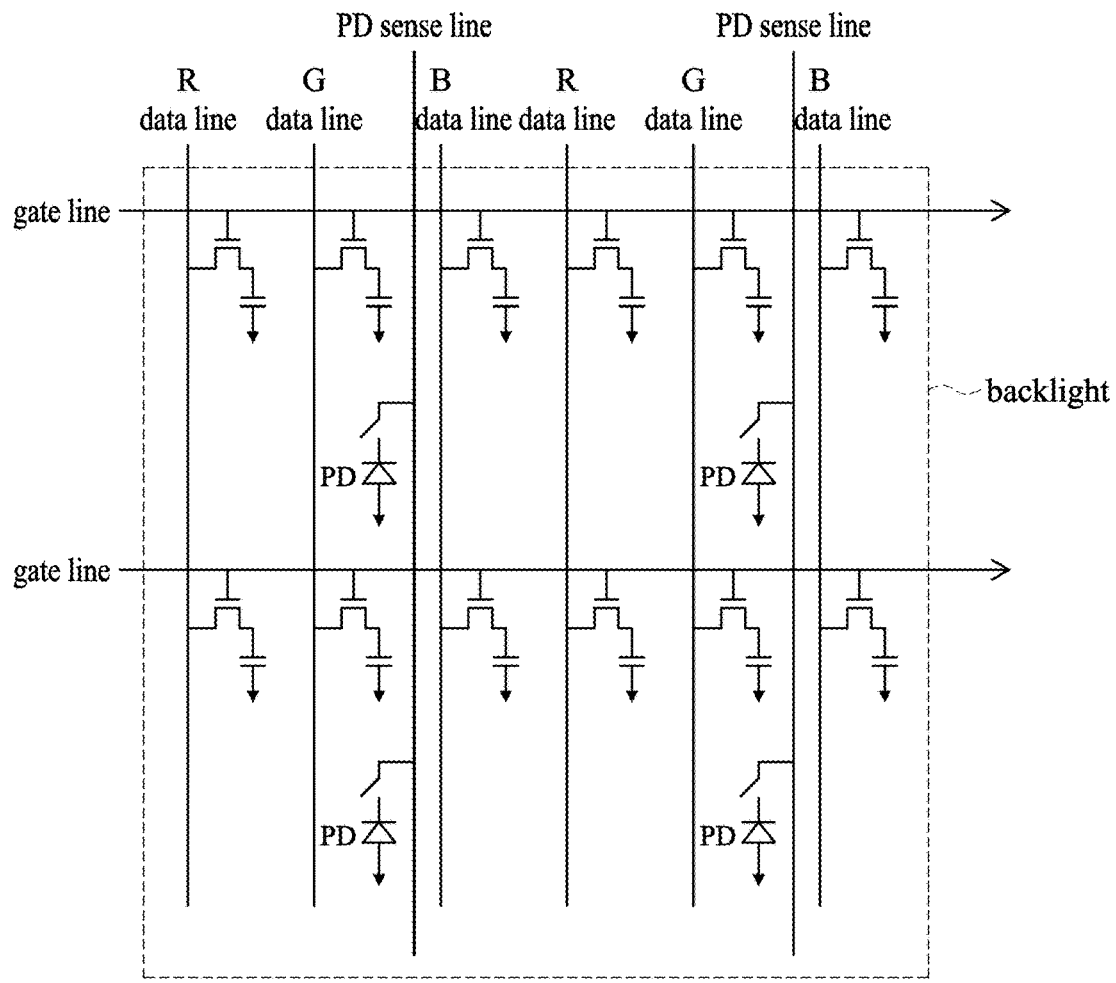
FIG. 1A shows a simplified circuit diagram illustrating a display panel embedded with photo detectors illuminated by a light source.
Figure 1B:
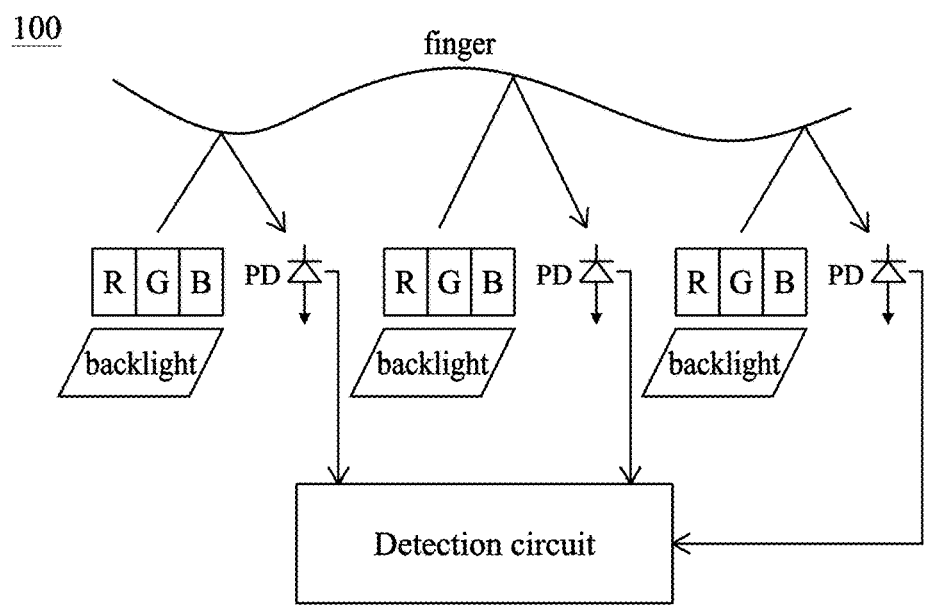
FIG. 1B shows a schematic diagram illustrating a fingerprint detection system composed of the display panel of FIG. 1A and a detection circuit configured to detect a fingerprint according to sense signals received from the photo detectors.

FIG. 1A shows a simplified circuit diagram illustrating a display panel (e.g., liquid crystal display panel) embedded with photo detectors PD (e.g., photo diodes) illuminated by a light source (e.g., backlight), and FIG. 1B shows a schematic diagram illustrating a fingerprint detection system 100 composed of the display panel of FIG. 1A and a detection circuit configured to detect a fingerprint according to sense signals received from the photo detectors PD. Although the liquid crystal display (LCD) panel is exemplified here, it is appreciated that other display panels, such as organic light-emitting diode (OLED) display panel or micro light-emitting diode (microLED) display panel, may be adopted instead.

Figures 2A, 2B:
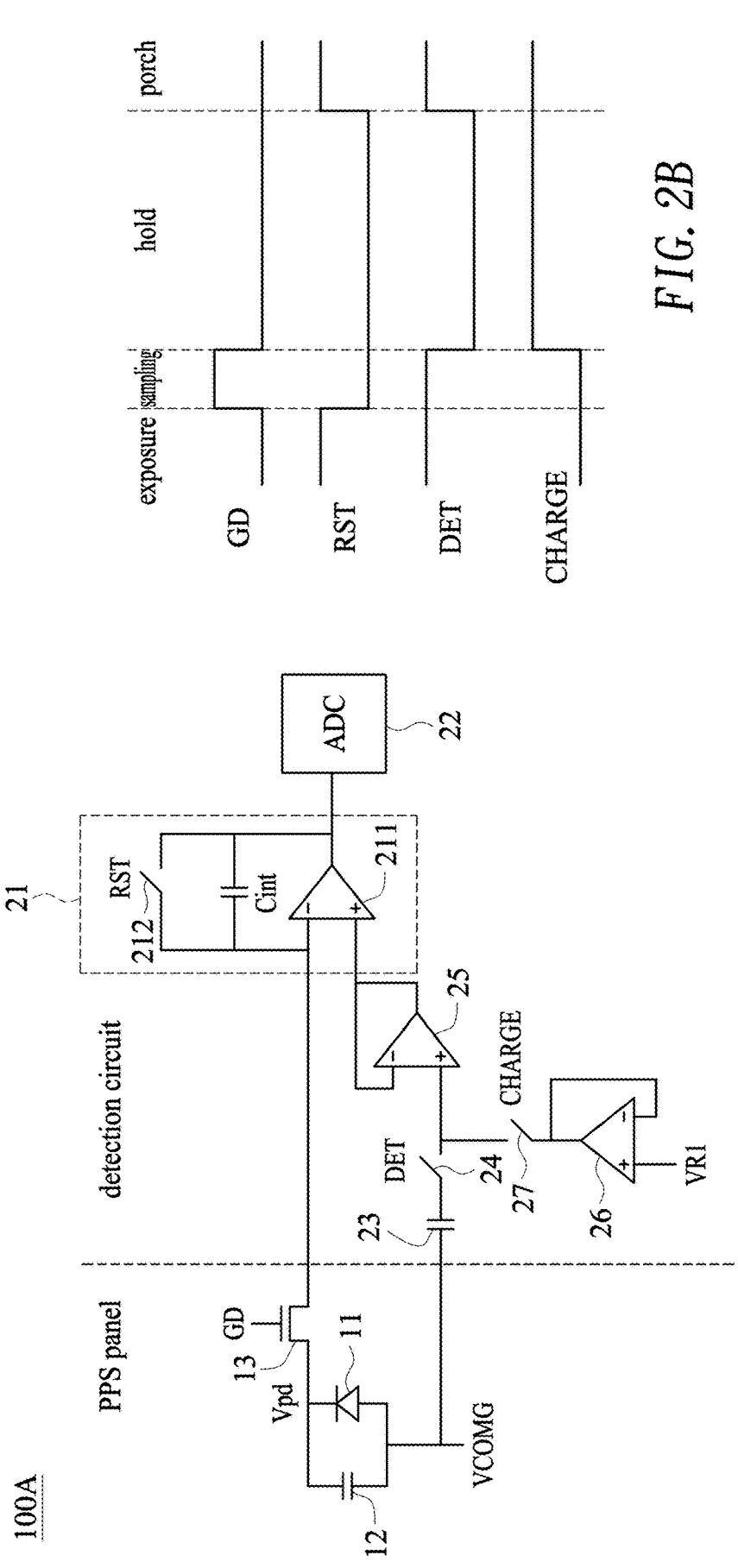
FIG. 2A shows a circuit diagram illustrating a fingerprint detection system adaptable to a passive-pixel sensor (PPS) panel according to a first embodiment of the present invention.
FIG. 2B shows a timing diagram illustrating pertinent signals of the fingerprint detection system of FIG. 2A.

FIG. 2A shows a circuit diagram illustrating a fingerprint detection system 100A adaptable to a passive-pixel sensor (PPS) panel according to a first embodiment of the present invention, and FIG. 2B shows a timing diagram illustrating pertinent signals of the fingerprint detection system 100A of FIG. 2A.

Specifically, the PPS panel may include (at least) a photo diode 11 and a capacitor 12 connected in parallel. The photo diode 11 has an anode electrode connected to a first common-mode voltage VCOMG, and a cathode electrode providing a photo-detected voltage Vpd. The PPS panel may include a sampling switch 13 (e.g., metal-oxide-semiconductor (MOS) transistor) coupled to receive the photo-detected voltage Vpd and controlled by a sampling signal GD.

The detection circuit of the fingerprint detection system 100A may include an integrator 21 coupled to receive the photo-detected voltage Vpd via the sampling switch 13 and configured to generate time integral of the photo-detected voltage Vpd, thereby resulting in a time-integral signal. In the embodiment, the integrator 21 may include an integrating amplifier 211 (e.g., operational amplifier) and an integrating capacitor Cint connected between an output node and an inverting input node of the integrating amplifier 211. The integrator 21 may further include an integrating reset switch 212 (controlled by a reset signal RST) connected between the output node and the inverting input node of the integrating amplifier 211.

The detection circuit of the fingerprint detection system 100A may include an analog-to-digital converter (ADC) 22 configured to convert the time-integral signal (of the integrator 21) into a digital form.

According to one aspect of the embodiment, the detection circuit of the fingerprint detection system 100A may include a first coupling capacitor 23 with a first plate connected to receive the first common-mode voltage VCOMG and a second plate electrically coupled to a non-inverting input node of the integrating amplifier 211 via a first detection switch 24 (controlled by a detection signal DET) and a first buffer amplifier 25 (e.g., operational amplifier). In one embodiment, the first buffer amplifier 25 may be a unit gain buffer amplifier with an output node connected to an inverting input node thereof.

In the embodiment, the detection circuit of the fingerprint detection system 100A may include a second buffer amplifier 26 (e.g., operational amplifier) configured to provide a first reference voltage VR1 to the non-inverting input node of the first buffer amplifier 25 via a first charge switch 27 (controlled by a charge signal CHARGE). In one embodiment, the second buffer amplifier 26 may be a unit gain buffer amplifier with an output node connected to an inverting input node thereof.

In operation, in an exposure interval, the sampling switch 13 and the first charge switch 27 are turned off, and the integrating reset switch 212 and the first detection switch 24 are turned on. Accordingly, the integrator 21 is reset, and the photo-detected voltage Vpd is generated.

Subsequently, in a sampling interval, the sampling switch 13 is turned on, the integrating reset switch 212 is turned off, while the first detection switch 24 stays turned on and the first charge switch 27 stays turned off. Accordingly, the photo-detected voltage Vpd is subjected to integration by the integrator 21. It is noted that, in the exposure and the sampling intervals, (sensor power) noise occurred in the first common-mode voltage VCOMG would be coupled (by the first coupling capacitor 23) to the integrator 21, thereby preventing the photo-detected voltage Vpd from being affected by the noise.

Next, in a hold interval, the sampling switch 13 and the first detection switch 24 are turned off, and the first charge switch 27 is turned on, while the integrating reset switch 212 stays turned off. Accordingly, the first reference voltage VR1 would be provided to the integrator 21 while the ADC 22 is performing the conversion.

In the embodiment, in a porch (or blanking) interval, the first detection switch 24 and the first charge switch 27 are both turned on, thereby charging the first coupling capacitor 23.

Figures 3A, 3B:
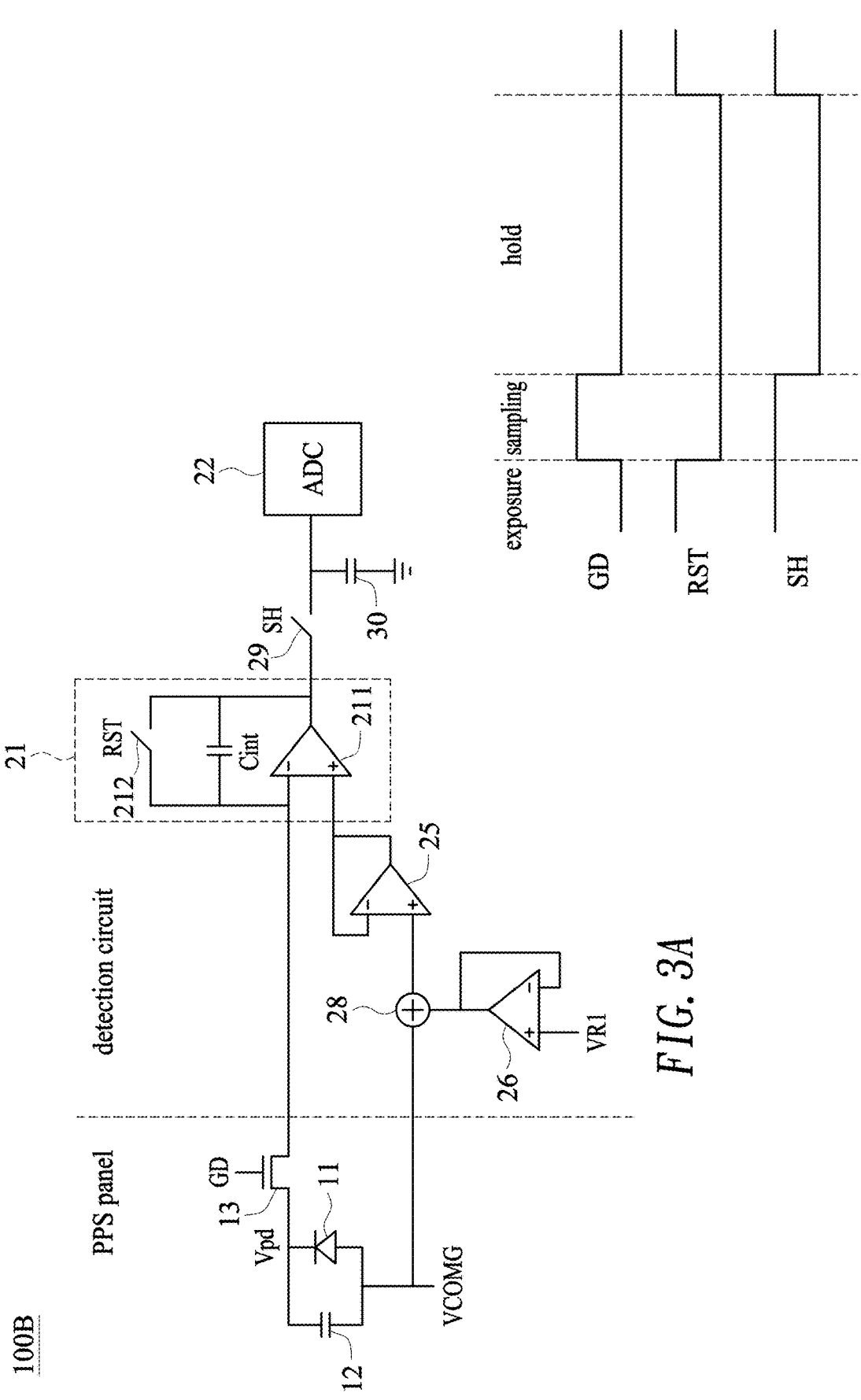
FIG. 3A shows a circuit diagram illustrating a fingerprint detection system adaptable to a passive-pixel sensor (PPS) panel according to a second embodiment of the present invention.
FIG. 3B shows a timing diagram illustrating pertinent signals of the fingerprint detection system of FIG. 3A.

FIG. 3A shows a circuit diagram illustrating a fingerprint detection system 100B adaptable to a passive-pixel sensor (PPS) panel according to a second embodiment of the present invention, and FIG. 3B shows a timing diagram illustrating pertinent signals of the fingerprint detection system 100B of FIG. 3A. The fingerprint detection system 100B of FIG. 3A is similar to the fingerprint detection system 100A of FIG. 2A with the following exceptions.

In the embodiment, instead of using the first coupling capacitor 23, the first detection switch 24 and the first charge switch 27, the detection circuit of the fingerprint detection system 100B may include a first voltage adder 28 configured to add the first common-mode voltage VCOMG and the first reference voltage VR1 buffered by the second buffer amplifier 26, thereby resulting a sum voltage fed to the non-inverting input node of the first buffer amplifier 25.

In the embodiment, the detection circuit of the fingerprint detection system 100B may include a conversion switch 29 (controlled by a conversion signal SH) connected between the integrator 21 and the ADC 22, and a conversion capacitor 30 connected between an input node of the ADC 22 and ground.

In operation, (sensor power) noise occurred in the first common-mode voltage VCOMG would be coupled (by the first voltage adder 28) to the integrator 21, thereby preventing the photo-detected voltage Vpd from being affected by the noise. In a hold interval during which the ADC 22 is performing the conversion, the conversion switch 29 is turned off to prevent the ADC 22 form being affected by the noise.

FIG. 4A shows a circuit diagram illustrating a fingerprint detection system 100C adaptable to an active-pixel sensor (APS) panel according to a third embodiment of the present invention, and FIG. 4B shows a timing diagram illustrating pertinent signals of the fingerprint detection system 100C of FIG. 4A. The fingerprint detection system 100C of FIG. 4A is similar to the fingerprint detection system 100A of FIG. 2A with the following exceptions.

In the embodiment, the APS panel may include a pull transistor 31 (with a gate controlled by a pull signal GR) connected between the cathode electrode of the photo diode 11 and a reset voltage VRST, and configured to pull up the photo-detected voltage Vpd to the reset voltage VRST.

The APS panel may include an intermediate transistor 32 (with a gate controlled by the photo-detected voltage Vpd) connected between a second common-mode voltage VCOMP and the sampling switch 13, where the second common-mode voltage VCOMP is higher than the first common-mode voltage VCOMG.

The detection circuit of the fingerprint detection system 100C may include a third buffer amplifier 33 (e.g., operational amplifier) configured to provide the reset voltage VRST. In one embodiment, the third buffer amplifier 33 may be a unit gain buffer amplifier with an output node connected to an inverting input node thereof.

The detection circuit of the fingerprint detection system 100C may include a second coupling capacitor 34 with a first plate connected to receive the first common-mode voltage VCOMG and a second plate electrically coupled to a non-inverting input node of the third buffer amplifier 33 via a (second) detection switch 35 (controlled by the detection signal DET).

The detection circuit of the fingerprint detection system 100C may include a fourth buffer amplifier 36 (e.g., operational amplifier) configured to provide a second reference voltage VR2 to the non-inverting input node of the third buffer amplifier 33 via a second charge switch 37 (controlled by the charge signal CHARGE). In one embodiment, the fourth buffer amplifier 36 may be a unit gain buffer amplifier with an output node connected to an inverting input node thereof.

In operation, in a reset interval, the pull transistor 31 is turned on to pull up the photo-detected voltage Vpd to the reset voltage VRST. It is noted that, in the exposure and the sampling intervals, (sensor power) noise occurred in the first common-mode voltage VCOMG would be coupled (by the first coupling capacitor 23) to the integrator 21 and coupled (by the second coupling capacitor 34) to the third buffer amplifier 33, thereby preventing the photo-detected voltage Vpd from being affected by the noise.

Next, in a hold interval, the first reference voltage VR1 would be provided to the integrator 21 and the second reference voltage VR2 would be provided to the third buffer amplifier 33 while the ADC 22 is performing the conversion.

Figure 5A:
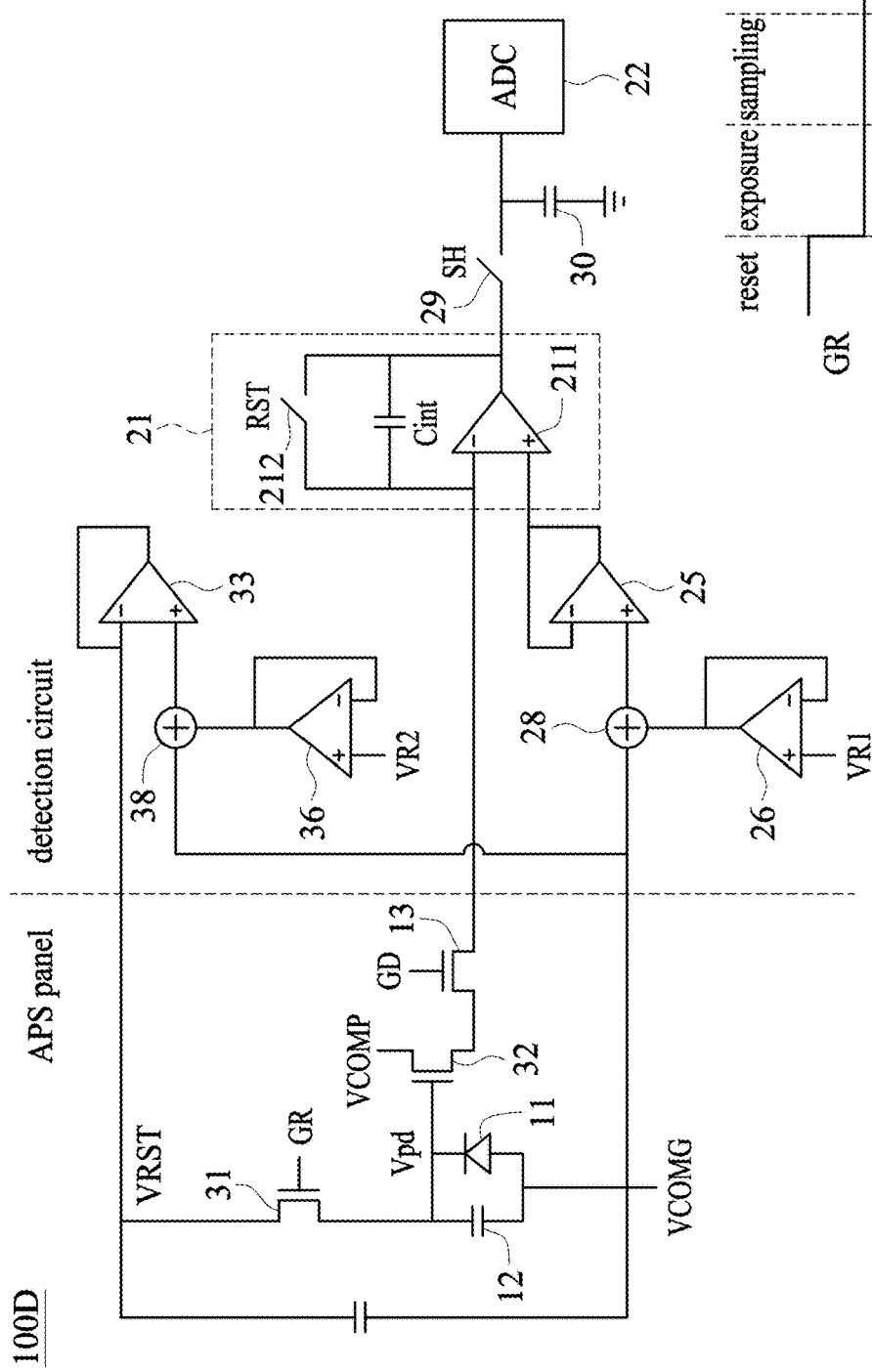
FIG. 5A shows a circuit diagram illustrating a fingerprint detection system adaptable to an active-pixel sensor (APS) panel according to a fourth embodiment of the present invention.
Figure 5B:
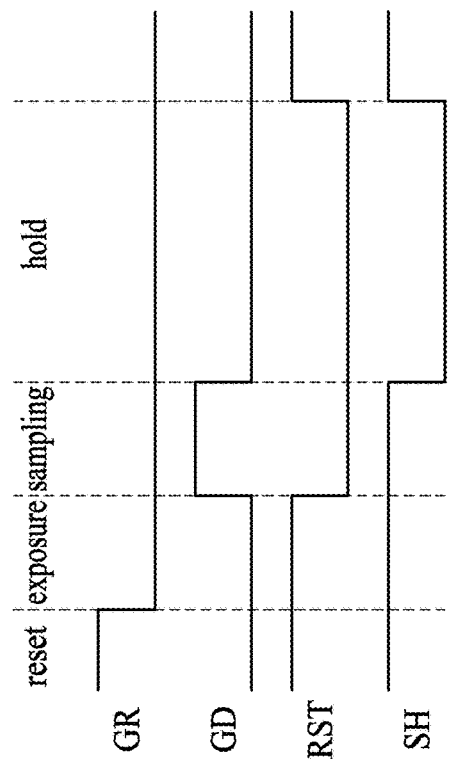
FIG. 5B shows a timing diagram illustrating pertinent signals of the fingerprint detection system of FIG. 5A.

FIG. 5A shows a circuit diagram illustrating a fingerprint detection system 100D adaptable to an active-pixel sensor (APS) panel according to a fourth embodiment of the present invention, and FIG. 5B shows a timing diagram illustrating pertinent signals of the fingerprint detection system 100D of FIG. The fingerprint detection system 100D of FIG. 5A is similar to the fingerprint detection system 100C of FIG. 4A with the following exceptions.

In the embodiment, instead of using the first coupling capacitor 23, the first detection switch 24 and the first charge switch 27, the detection circuit of the fingerprint detection system 100D may include a first voltage adder 28 configured to add the first common-mode voltage VCOMG and the first reference voltage VR1 buffered by the second buffer amplifier 26, thereby resulting a sum voltage fed to the non-inverting input node of the first buffer amplifier 25. Similarly, the detection circuit of the fingerprint detection system 100D may include a second voltage adder 38 configured to add the first common-mode voltage VCOMG and the second reference voltage VR2 buffered by the fourth buffer amplifier 36, thereby resulting a sum voltage fed to the non-inverting input node of the third buffer amplifier 33.

In the embodiment, the detection circuit of the fingerprint detection system 100D may include a conversion switch 29 (controlled by a conversion signal SH) connected between the integrator 21 and the ADC 22, and a conversion capacitor 30 connected between an input node of the ADC 22 and ground.

In operation, (sensor power) noise occurred in the first common-mode voltage VCOMG would be coupled (by the first voltage adder 28) to the integrator 21 and coupled (by the second voltage adder 38) to the third buffer amplifier 33, thereby preventing the photo-detected voltage Vpd from being affected by the noise. In a hold interval during which the ADC 22 is performing the conversion, the conversion switch 29 is turned off to prevent the ADC 22 form being affected by the noise.

Although specific embodiments have been illustrated and described, it will be appreciated by those skilled in the art that various modifications may be made without departing from the scope of the present invention, which is intended to be limited solely by the appended claims.

What is claimed is:

1. A fingerprint detection system, comprising:
   a sensor panel including:
      a photo diode having an anode electrode connected to a first common-mode voltage and a cathode electrode providing a photo-detected voltage; and
      a sampling switch coupled to receive the photo-detected voltage;
   a detection circuit including:
      an integrator coupled to receive the photo-detected voltage via the sampling switch and configured to generate time integral of the photo-detected voltage, thereby resulting in a time-integral signal; and
      an analog-to-digital converter (ADC) that converts the time-integral signal into a digital form;
   wherein the first common-mode voltage is coupled to the integrator to prevent noise occurred in the first common-mode voltage from affecting the time-integral signal;
   wherein the integrator comprises:
      an integrating amplifier; and
      an integrating capacitor connected between an output node and an inverting input node of the integrating amplifier;
   wherein the detection circuit comprises:
      a first coupling capacitor with a first plate connected to receive the first common-mode voltage and a second plate electrically coupled to a non-inverting input node of the integrating amplifier;
   wherein the detection circuit comprises a first detection switch and a first buffer amplifier, via which the second plate of the first coupling capacitor is electrically coupled to the integrating amplifier.

2. The system of claim 1, wherein the detection circuit comprises:
   a first charge switch; and
   a second buffer amplifier that provides a first reference voltage to the non-inverting input node of the first buffer amplifier via the first charge switch, thereby providing the first reference voltage to the non-inverting input node of the integrating amplifier.

3. The system of claim 2, wherein the detection circuit comprises:
   a third buffer amplifier that provides a reset voltage.

4. The system of claim 3, wherein the detection circuit comprises:
   a second detection switch; and
   a second coupling capacitor with a first plate connected to receive the first common-mode voltage and a second plate electrically coupled to a non-inverting input node of the third buffer amplifier via the second detection switch.

5. The system of claim 4, wherein the detection circuit comprises:
   a second charge switch; and
   a fourth buffer amplifier that provides a second reference voltage to the non-inverting input node of the third buffer amplifier via the second charge switch.

6. The system of claim 5, wherein the sensor panel comprises:
   a pull transistor connected between the cathode electrode of the photo diode and the reset voltage, and configured to pull up the photo-detected voltage to the reset voltage; and
   an intermediate transistor connected between a second common-mode voltage and the sampling switch, the second common-mode voltage being higher than the first common-mode voltage.

7. The system of claim 1, wherein the integrator comprises:
   an integrating reset switch connected between the output node and the inverting input node of the integrating amplifier.

8. A fingerprint detection system, comprising:
   a sensor panel including:
      a photo diode having an anode electrode connected to a first common-mode voltage and a cathode electrode providing a photo-detected voltage; and
      a sampling switch coupled to receive the photo-detected voltage;
   a detection circuit including:
      an integrator coupled to receive the photo-detected voltage via the sampling switch and configured to generate time integral of the photo-detected voltage, thereby resulting in a time-integral signal; and
      an analog-to-digital converter (ADC) that converts the time-integral signal into a digital form;

wherein the first common-mode voltage is coupled to the integrator to prevent noise occurred in the first common-mode voltage from affecting the time-integral signal;
wherein the integrator comprises:
an integrating amplifier; and
an integrating capacitor connected between an output node and an inverting input node of the integrating amplifier;
wherein the detection circuit comprises:
a conversion switch connected between the integrator and the ADC; and
a conversion capacitor connected between an input node of the ADC and ground;
wherein the detection circuit comprises:
a first buffer amplifier;
a second buffer amplifier that provides a first reference voltage; and
a first voltage adder that adds the first common-mode voltage and the first reference voltage, thereby resulting a sum voltage fed to a non-inverting input node of the first buffer amplifier, which provides the first reference voltage to a non-inverting input node of the integrating amplifier.

9. The system of claim 8, wherein the detection circuit comprises:
a third buffer amplifier that provides a reset voltage;
a fourth buffer amplifier that provides a second reference voltage to a non-inverting input node of the third buffer amplifier; and
a second voltage adder that adds the first common-mode voltage and the second reference voltage, thereby resulting a sum voltage fed to the non-inverting input node of the third buffer amplifier.

10. The system of claim 9, wherein the sensor panel comprises:
a pull transistor connected between the cathode electrode of the photo diode and the reset voltage, and configured to pull up the photo-detected voltage to the reset voltage; and
an intermediate transistor connected between a second common-mode voltage and the sampling switch, the second common-mode voltage being higher than the first common-mode voltage.

11. A detection circuit adaptable to a fingerprint detection system, the detection circuit comprising:
an integrating amplifier coupled to receive a photo-detected voltage from a sensor panel and configured to generate time integral of the photo-detected voltage, thereby resulting in a time-integral signal;
an analog-to-digital converter (ADC) that converts the time-integral signal into a digital form;
a conversion switch connected between the integrating amplifier and the ADC;
a conversion capacitor connected between an input node of the ADC and ground;
a first buffer amplifier;
a second buffer amplifier that provides a first reference voltage; and
a first voltage adder that adds the first common-mode voltage and the first reference voltage, thereby resulting a sum voltage fed to a non-inverting input node of the first buffer amplifier, which provides the first reference voltage to a non-inverting input node of the integrating amplifier;
wherein a first common-mode voltage of the sensor panel is coupled to the integrating amplifier to prevent noise occurred in the first common-mode voltage from affecting the time-integral signal.

12. The circuit of claim 11, comprising:
a third buffer amplifier that provides a reset voltage;
a fourth buffer amplifier that provides a second reference voltage to a non-inverting input node of the third buffer amplifier; and
a second voltage adder that adds the first common-mode voltage and the second reference voltage, thereby resulting a sum voltage fed to the non-inverting input node of the third buffer amplifier.

13. A detection circuit adaptable to a fingerprint detection system, the detection circuit comprising:
an integrating amplifier coupled to receive a photo-detected voltage from a sensor panel and configured to generate time integral of the photo-detected voltage, thereby resulting in a time-integral signal;
an analog-to-digital converter (ADC) that converts the time-integral signal into a digital form;
a first coupling capacitor with a first plate connected to receive the first common-mode voltage and a second plate electrically coupled to a non-inverting input node of the integrating amplifier;
wherein a first common-mode voltage of the sensor panel is coupled to the integrating amplifier to prevent noise occurred in the first common-mode voltage from affecting the time-integral signal;
a buffer amplifier that provides a reset voltage;
a detection switch; and
a second coupling capacitor with a first plate connected to receive the first common-mode voltage and a second plate electrically coupled to a non-inverting input node of the buffer amplifier via the detection switch.

* * * * *